US011867931B2

(12) United States Patent
Luo et al.

(10) Patent No.: US 11,867,931 B2
(45) Date of Patent: Jan. 9, 2024

(54) FABRICATION OF DIFFRACTIVE OPTIC ELEMENT HAVING A VARIABLE REFRACTIVE INDEX PROFILE BY INKJET PRINTING DEPOSITION

(71) Applicant: Applied Materials, Inc., Santa Clara, CA (US)

(72) Inventors: Kang Luo, Santa Clara, CA (US); Xiaopei Deng, San Jose, CA (US); Daihua Zhang, Los Altos, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/448,619

(22) Filed: Sep. 23, 2021

(65) Prior Publication Data

US 2022/0091314 A1   Mar. 24, 2022

Related U.S. Application Data

(60) Provisional application No. 63/082,314, filed on Sep. 23, 2020.

(51) Int. Cl.
*G02B 5/18* (2006.01)
*G03F 7/00* (2006.01)
*G03F 7/16* (2006.01)

(52) U.S. Cl.
CPC ......... *G02B 5/1857* (2013.01); *G03F 7/0005* (2013.01); *G03F 7/16* (2013.01)

(58) Field of Classification Search
None
See application file for complete search history.

(56) References Cited

U.S. PATENT DOCUMENTS 9,333,717 B2 * 5/2016 Pitwon ................ G02B 6/1221
10,983,257 B1 * 4/2021 Colburn ............. G02B 27/0172
(Continued)

FOREIGN PATENT DOCUMENTS

JP   2020522021 A   7/2020
WO  2020018270 A1   1/2020

OTHER PUBLICATIONS

PCT/US2021/051798, International Search Report and Written Opinion dated Jan. 3, 2022, 11 pages.

*Primary Examiner* — Shamim Ahmed
(74) *Attorney, Agent, or Firm* — Patterson + Sheridan, LLP

(57) ABSTRACT

Embodiments of the present disclosure generally relate to optical devices. More specifically, embodiments described herein relate to optical devices and methods of manufacturing optical devices having optical device structures with at least one of varying depths or refractive indices across the surface of a substrate. According to certain embodiments, an inkjet process is used to deposit a volumetrically variable optical device that is etched to form a diffractive optic element (DOE). Volumetrically variable can relate to the thickness of the optical device, or the relative volume of two or more diffractive materials deposited in combination. According to other embodiments, a single-profile DOE is deposited on a substrate and an inkjet process deposits a volumetrically variable organic material over the DOE. The DOE and organic material are etched to modify the profile of the structure, after which the organic material is removed, leaving the modified-profile DOE.

14 Claims, 9 Drawing Sheets

(56) References Cited

U.S. PATENT DOCUMENTS

| | | |
|---|---|---|
| 2011/0292511 A1 | 12/2011 | Bentley |
| 2015/0331149 A1* | 11/2015 | Bookbinder ............. G02B 1/11 |
| | | 359/601 |
| 2016/0216416 A1* | 7/2016 | Tekolste ............. B29D 11/0073 |
| 2018/0095201 A1 | 4/2018 | Melli et al. |
| 2019/0258008 A1 | 8/2019 | Hautala et al. |
| 2019/0324176 A1* | 10/2019 | Colburn ................ G03F 7/0035 |
| 2019/0326454 A1* | 10/2019 | Greer ................... H01L 31/036 |

* cited by examiner

FABRICATION OF DIFFRACTIVE OPTIC ELEMENT HAVING A VARIABLE REFRACTIVE INDEX PROFILE BY INKJET PRINTING DEPOSITION

CROSS-REFERENCE TO RELATED APPLICATIONS

This application claims the benefit of U.S. Provisional Application 63/082,314 filed on Sep. 23, 2020, which is incorporated in its entirety.

BACKGROUND

Field

Embodiments of the present disclosure generally relate to optical devices. More specifically, embodiments described herein relate to optical devices and methods of manufacturing optical devices having optical device structures with varying profiles and refractive indices.

Description of the Related Art

Diffractive optic elements (DOEs) are a common optic element for solutions that manipulate light, such as combining, focusing, or other functionality. Example applications of DOEs include virtual reality and augmented reality products that enhance or alter images in a user's field of vision. Virtual reality is generally considered a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that visually replaces an actual environment in a user's field of vision.

Augmented reality, however, enables an experience in which a user can still see through the display lenses of the glasses or other HMD device to view the surrounding environment, yet also see images of virtual objects that are generated for display, and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlaid on an ambient environment. Augmented waveguide combiners are used to assist in overlaying images. Generated light is in-coupled into an augmented waveguide combiner, propagated through the augmented waveguide combiner, out-coupled from the augmented waveguide combiner, and overlaid on the ambient environment. Light is coupled into and out of augmented waveguide combiners using surface relief gratings. The diffraction efficiency and directionality of the out-coupled light may not be adequately controlled.

Accordingly, what is needed in the art are improved systems and methods for DOE fabrication.

SUMMARY

Embodiments of the present disclosure generally relate to optical devices. More specifically, embodiments described herein relate to optical devices and methods of manufacturing optical devices having optical device structures with at least one of varying depths or refractive indices across the surface of a substrate. According to certain embodiments, an inkjet process is used to deposit a volumetrically variable optical device that is etched to form a diffractive optic element (DOE). Volumetrically variable can relate to the thickness of the optical device, or the relative volume of two or more diffractive materials deposited in combination. According to other embodiments, a single-profile DOE is deposited on a substrate and an inkjet process deposits a volumetrically variable organic material over the DOE. The DOE and organic material are etched to modify the profile of the structure, after which the organic material is removed, leaving the modified-profile DOE.

According to certain embodiments a system for fabricating a diffractive optics element (DOE) is disclosed, that includes one or more processors configured to cause the system to receive a substrate, and deposit a film layer having a thickness using an inkjet process on a portion of the substrate, the film layer being volumetrically varied to vary refractive properties of the film layer.

In certain embodiments, a non-transitory computer-readable storage medium storing instructions is disclosed that, when executed by a processor of a processing system, cause the processing system to receive a substrate, and deposit a film layer having a thickness using an inkjet process on a portion of the substrate, the film layer being volumetrically varied to vary refractive properties of the film layer.

In certain embodiments, a system for fabricating a diffractive optics element (DOE) is disclosed that includes one or more processors configured to cause the system to receive a substrate having a uniform DOE provided thereon, and deposit a film layer having a thickness using an inkjet process, the film layer being volumetrically varied on the DOE, to form an encapsulated uniform DOE.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optical devices. More specifically, embodiments described herein relate to optical devices and methods of manufacturing optical devices having optical device structures with at least one of varying depths or refractive indices across the surface of a substrate. According to certain embodiments, an inkjet process is used to deposit a volumetrically variable optical device that is etched to form a diffractive optic element (DOE). Volumetrically variable can relate to the thickness of the optical device, or the relative volume of two or more diffractive materials deposited in combination. According to other embodiments, a single-profile DOE is deposited on a substrate and an inkjet process deposits a volumetrically variable organic material over the DOE. The DOE and organic material are etched to modify the profile of the structure, after which the organic material is removed, leaving the modified-profile DOE.

Conventionally, DOEs having a varying thickness profile are developed through an iterative process requiring multiple steps to define the DOE variable profile that include overcoat, photolithography, and etch. In addition to being time consuming and expensive, each iteratively deposited and etched layer comes with additional risk of introduction of error, whether through process error, contamination, misplacement, and the like.

According to certain embodiments, shortcomings of conventional approaches may be at least partially avoided by using an inkjet process to deposit a variable profile structure onto a substrate, and etching this structure to obtain a desired profiled DOE. In some embodiments, the variable profile structure is volumetrically variable to provide a variable thickness over the course of the deposited structure, using variable flow characteristics of inkjet deposition processes. In other embodiments, the variable profile structure is volumetrically variable to provide varying volumes of materials having different refractive index (RI) properties, while the thickness is maintained at a constant thickness. According to some embodiments, the profile may have a variable thickness in addition to a variable composition of materials having different RI properties.

Example System

Figure 1:
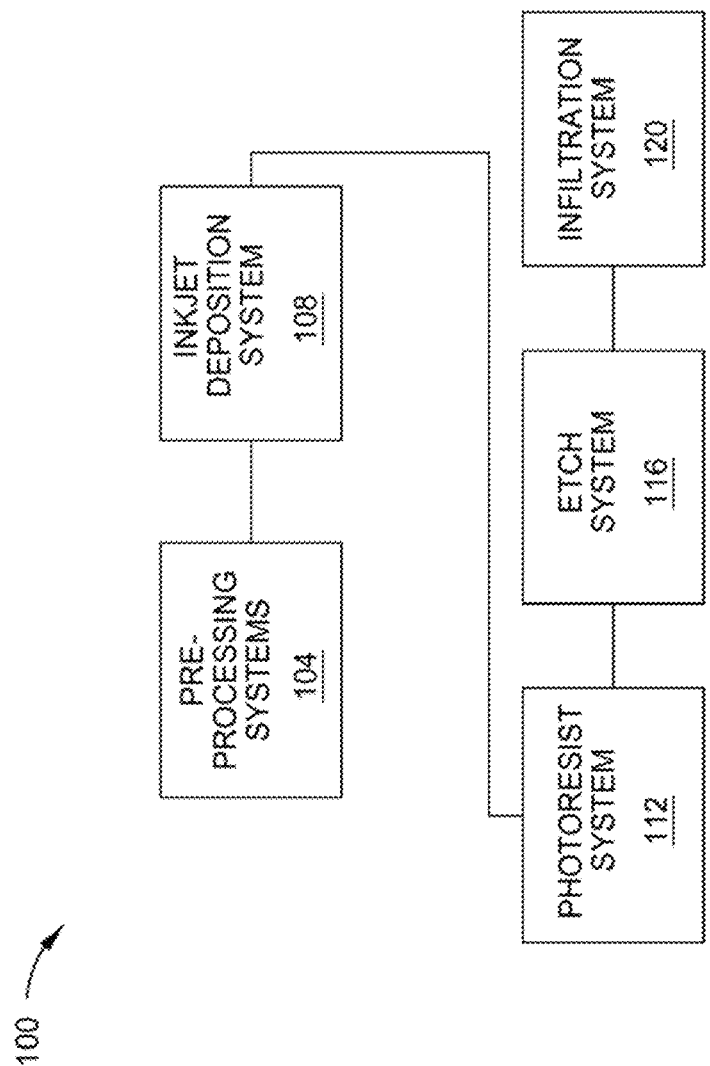
FIG. 1 depicts a system for fabrication of a diffractive optic element (DOE) having a variable refractive index (RI) profile, according to certain embodiments.

FIG. 1 depicts a system 100 for fabrication of a diffractive optic element (DOE) having a variable refractive index (RI) profile, according to certain embodiments. Pre-processing system 104 includes one or more systems for processing a substrate prior to depositing one or more structures using an inkjet deposition system 108 discussed below. Pre-processing systems 104 may include any type of deposition process, such as chemical vapor deposition (CVD), atomic layer deposition (ALD), physical vapor deposition (PVD), or the like, an epitaxy-based processing system or the like, or other system that may deposit or otherwise provide for material build up on the substrate. Pre-processing system 104 may further include, either alone or in combination with systems capable of performing a deposition process, one or more systems capable of etching the substrate, and/or materials deposited on the substrate. Pre-processing system 104 may further include systems for the application of one or more processing masks, such as etch resistant masks for applying a desired pattern to the substrate or material provided on the substrate. By way of example photoresist systems may include as spin coating systems, photolithography systems, a deposition system as described above, or other systems capable of applying a processing mask, either alone or in combination with systems for deposition and etch as described above. As would be appreciated by one of skill in the art, there may be other systems for pre-processing the substrate, such as polishing, cleaning, or other processes that may be needed prior to the deposition by inkjet deposition system 108.

As a result of pre-processing systems 104, the substrate is provided that may contain one or more DOE structures, or no DOE structure, for further processing by inkjet deposition system 108.

Inkjet deposition system 108 is a system capable of providing defined volumes of a fluid, combinations of a fluid and particulate matter, or combinations of one or more of these (collectively a "fluid"), encapsulated in a droplet that is deposited a nozzle. Inkjet deposition system 108 may include more than one nozzle. Example fluids include organic film fluids similar to photoresist mask organic films and fluids chosen for their refractive index (RI) properties that may include particles such as diamond or other materials having high RI properties. Examples of organic films include UV curable epoxy, thermal curable epoxy, and/or acrylates; examples of refractive index materials include inorganic thin film materials such as nanoparticles/nanodiamond ink, sol-gel ink. Examples of sol-gel materials include titanium isopropoxide and titanium(IV) butoxide. For materials including nanoparticles, examples of such nanoparticles include $TiO_2$ and $ZrO_2$. An example of inkjet deposition system 108 in this context include LP50 Advanced Research Inkjet Printer from SUSS MICROTEC.

The one or more nozzles, and related pumps, may provide a defined volume of fluid in each droplet, and vary the number of droplets deposited per unit of time, enabling the inkjet deposition system 108 to vary the thickness of the material deposited on the substrate. By varying the number of droplets deposited per unit of time, a material of variable profile shape may be deposited on the substrate, such as a wedge. Alternatively, or additionally, the relative volume of two or more fluids contained in a droplet may be varied, enabling a consistent profile shape to be deposited on the substrate having variable refractive index properties that vary over the consistent profile shape at a linear, exponential, geometric, or variable rate. According to some embodiments, the relative volume of materials making up the deposited fluid may be deposited in varying volumes, enabling variable profile structures that can additionally vary as the relative volume of the fluids vary during deposition.

System 100 further includes a photoresist system 112 for depositing photoresist in the structure deposited by the inkjet deposition system 108. Deposited photoresist may be an organic photoresist material such as positive or negative tone photoresist, a metal-containing hardmask, a carbon containing hardmask, an organic planarization layer, or other suitable photoresist mask. The deposited photoresist mask may be further patterned by photoresist system 112 by a suitable process that may include one or more of photolithography, PVD, CVD, plasma enhanced CVD (PECVD), flowable CVD (FCVD), ALD, and spin-on processes. In certain embodiments after deposition in the inkjet deposition system 108, the substrate may optionally bypass the photoresist system 112, for applications such as described below, where the material deposited by the inkjet deposition system 108 is etched directly in an etch system 116.

System 100 further includes the etch system 116 for etching the substrate after deposition by the inkjet deposition system 108 and photoresist system 112 (as needed). Suitable etch processes include and are not limited to wet etching, dry etching, reactive ion etching, and plasma etching. According to certain embodiments, etch system 116 is used to etch the inkjet-deposited material according to a deposited patterned mask, to form one or more DOE structures that have a variable RI profile. The variable RI profile may have variable RI properties due to varying thickness over the shape of the structure, variable relative volume concentrations of two or more deposited materials, or a combination of these. Variable RI profile structures resulting from system 100 are described further below. Etch system 116 further includes one or more cleaning systems, to remove debris and clean up structural anomalies resulting from an etch process.

System 100 further includes an infiltration system 120. As a result of the etch process and annealing processes (not shown) associated with other parts of the system 100, voids or gaps may form in the resulting DOE structures. According to certain embodiments, an annealing process may be carried out after deposition of a structure that will become a DOE, either before or after etching to form the DOE. To mitigate the impact on refractive properties of the DOE, the DOE formed on the substrate may optionally be provided to the infiltration system 120. Examples of an infiltration process includes ALD or chemical vapor deposition (CVD), and example infiltration precursors include [Ti(NMe$_2$)$_4$] (TDMAT), TiCl$_4$, and [Ti(iOPr)$_4$] (TTIP). An infiltration process in this context provides infiltration precursors into optical structures in order to fill in gaps within the structure. In certain embodiments, an infiltration process may leave a film layer on top of the optical structure, which may be removed.

Figure 2:
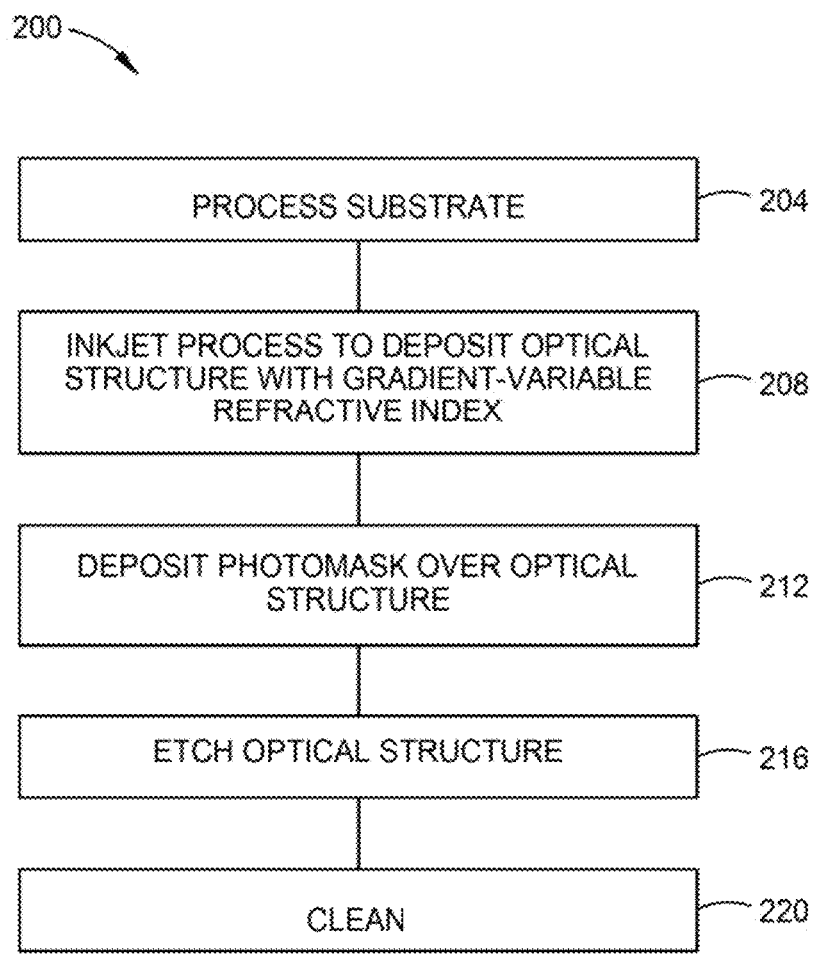
FIG. 2 depicts a flow diagram for the fabrication of a diffractive optic element having a variable refractive index profile, according to certain embodiments.
Figure 3:
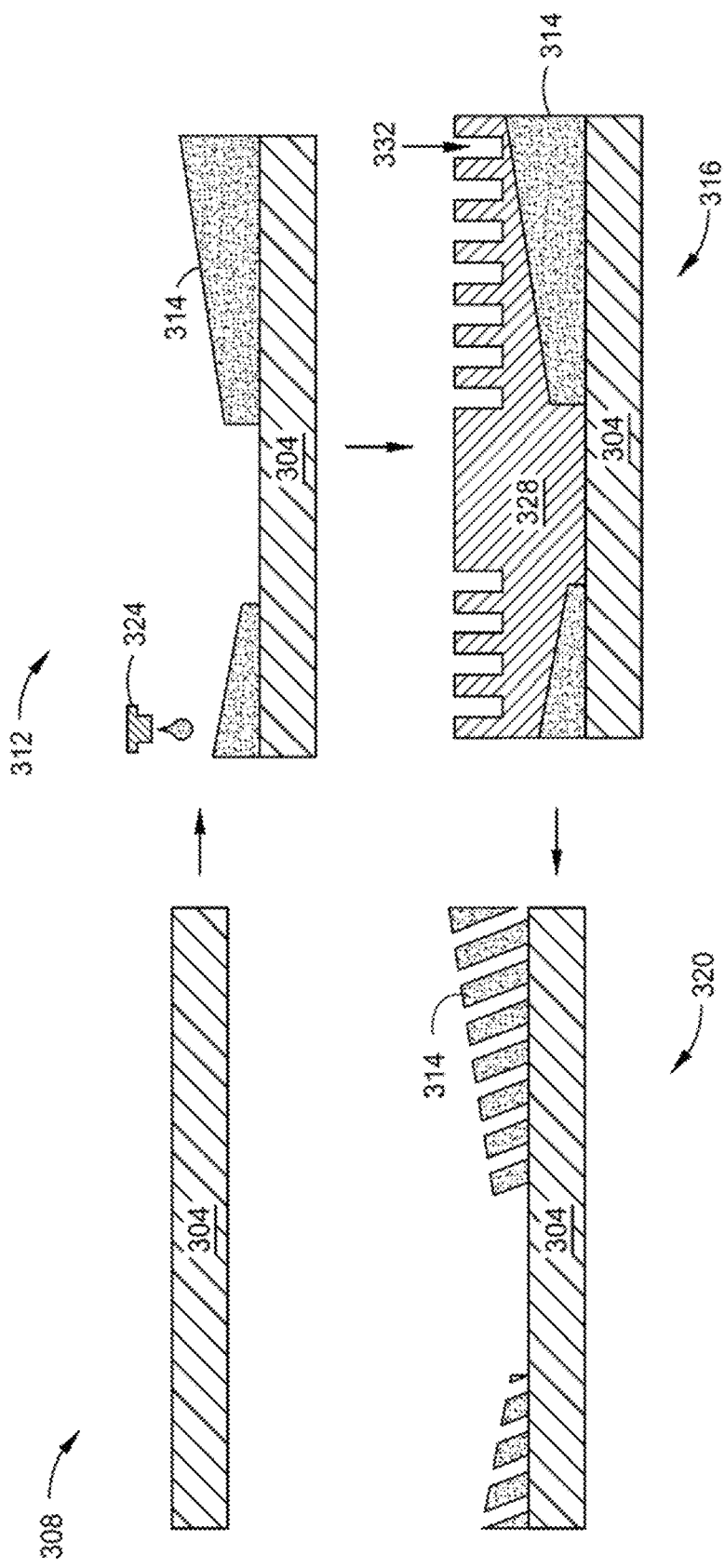
FIG. 3 depicts a process flow for the fabrication of a diffractive optic element having a variable refractive index profile, according to certain embodiments.

FIG. 2 depicts a flow diagram 200 for the fabrication of a diffractive optic element having a variable refractive index profile, according to certain embodiments. At block 204 a substrate, such as substrate 304 depicted at process 308 of FIG. 3, is processed, such as by pre-processing systems 104 of FIG. 1. At block 208, inkjet deposition system 108 deposits an optical structure 314 with a variable RI gradient on substrate 304 with inkjet nozzle 324, as depicted at process 312 of FIG. 3. The variable RI gradient may be accomplished by varying the volume of droplets deposited, resulting in a structure having variable thickness profile such as a wedge such as depicted in FIG. 3.

At block 212, photoresist system 112 applies a photoresist mask 328 on the optical structure 314, as depicted at process 316 of FIG. 3. According to certain embodiments, the photoresist mask 328 may include a pattern 332.

At block 216, etch system 116 etches the optical structure 314 and photoresist mask 328, resulting in the optical structure 314 being a DOE having the desired variable RI profile, as depicted at process 320 of FIG. 3. In this context, etch system 116 may include an ion beam etch system, while in other embodiments a dry etch system is utilized. At block 220, the optical structure 314 and substrate 304 are cleaned, and in some embodiments, provided to infiltration system 120 for mitigation of gaps formed in the optical structure 314. In some embodiments, the cleaning process utilizes an O$_2$ ash process, while in other embodiments a wet cleaning process may be utilized.

Figure 4:
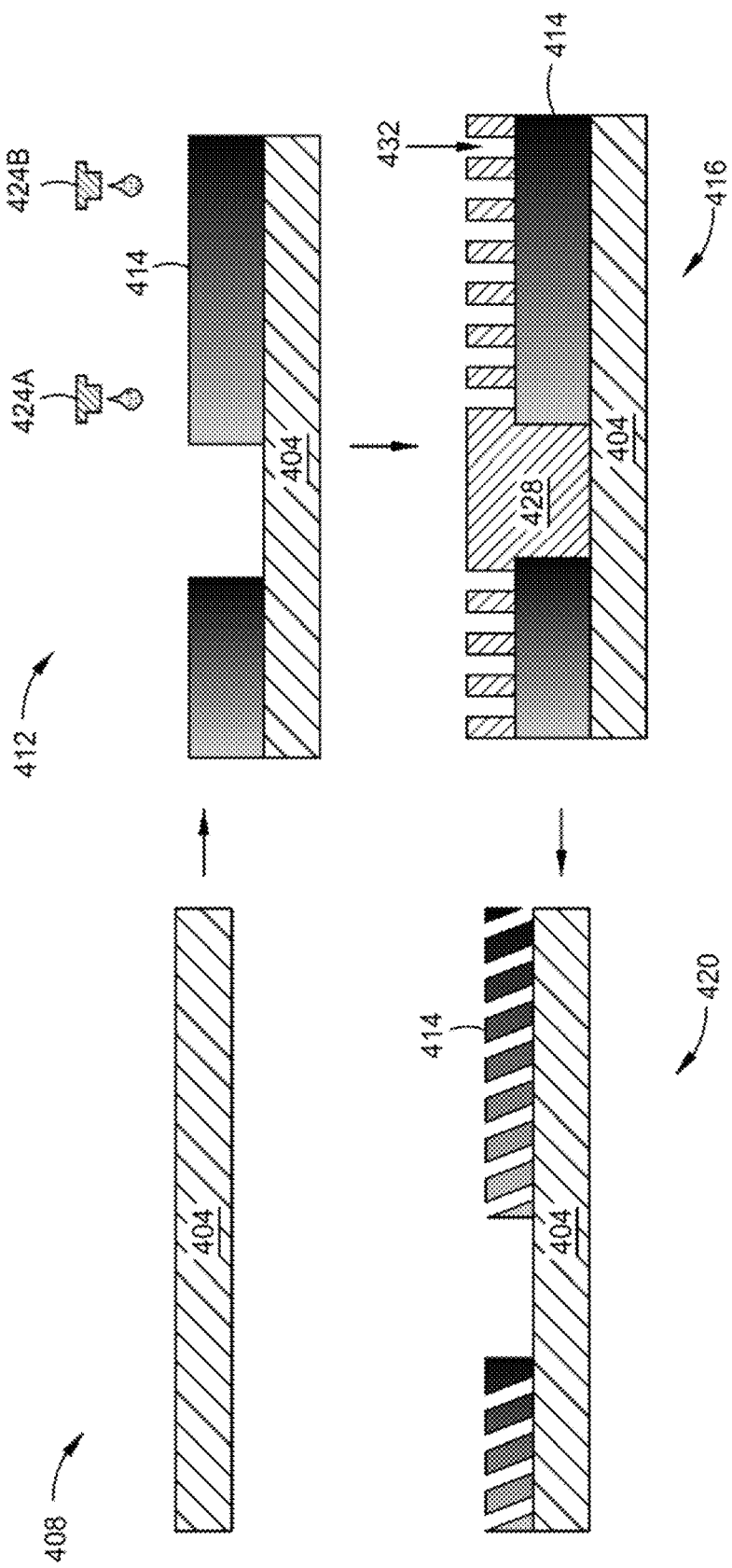
FIG. 4 depicts a process flow for the fabrication of a diffractive optic element having a variable refractive index profile, according to certain embodiments.

Alternatively, at block 204 a substrate, such as substrate 404 depicted at process 408 of FIG. 4, is processed, such as by pre-processing systems 104 of FIG. 1. At block 208, inkjet deposition system 108 deposits an optical structure 414 with a variable RI gradient on substrate 404 with inkjet nozzles 424A and 424B, as depicted at process 412 of FIG. 4.

According to certain embodiments, inkjet nozzle 424A deposits a first solution. The first solution may be a sol-gel solution or a nanoparticle solution. The first solution may include silicon dioxide (SiO2), silicon oxycarbide (SiOC), zirconium dioxide (ZrO2), and/or titanium dioxide (TiO2). Proportions of SiO2, SiOC, ZrO2, and/or TiO2 in the first solution are controlled to result in a first refractive index. For example, the first solution may contain a first ratio of TiO2 to SiO2, SiOC, and/or ZrO2. In one embodiment, sol-gel precursors for SiO2 may include tetramethyl orthosilicate (TMOS), methyl-tri-methoxy-silane (MTMS), and tetraethyl orthosilicate (TEOS).

According to certain embodiments, inkjet nozzle 424B deposits a second solution. The second solution may be a sol-gel solution or a nanoparticle solution. The second solution may include SiO2, SiOC, ZrO2, and/or TiO2. Proportions of SiO2, SiOC, ZrO2, and/or TiO2 in the second solution are controlled to result in a second refractive index. The second refractive index may be different from the first refractive index. For example, the second solution may contain a second ratio having a higher ratio of TiO2 to SiO2, SiOC, and/or ZrO2 than the first ratio to result in the second refractive index having a higher refractive index than the first refractive index or the second ratio may have a lower ratio of TiO2 to SiO2, SiOC, and/or ZrO2 than the first ratio to result in the second refractive index having a lower refractive index than the first refractive index.

The variable RI gradient may be accomplished by varying the relative volume of droplets deposited from inkjet nozzle 424A and inkjet nozzle 424B, varying the relative concentration of each of the material provided by each nozzle by adjusting the volume deposited by each, during the deposition of the optical structure 414, resulting in a structure having variable RI gradient profile such as depicted in FIG. 4. According to certain embodiments, a variable RI gradient may be accomplished by combining the techniques depicted in FIGS. 3 and 4.

Continuing the alternative example, at block 212, photoresist system 112 applies a photoresist mask 428 on the optical structure 414, as depicted at process 416 of FIG. 4. According to certain embodiments, the photoresist mask 428 may include a pattern 432.

Continuing the alternative example, at block 216, etch system 116 etches the optical structure 414 and photoresist mask 428, resulting in the optical structure 414 being a DOE having the desired variable RI profile, as depicted at process 420 of FIG. 4. At block 220, the optical structure 414 and substrate 404 are cleaned, and in some embodiments, provided to infiltration system 120 for mitigation of gaps formed in the optical structure 414.

Figure 5:
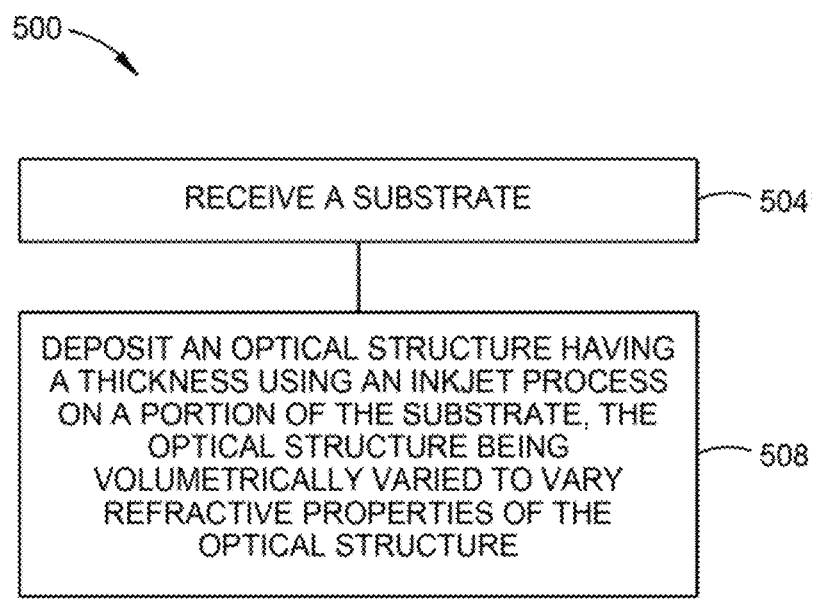
FIG. 5 depicts a method for fabrication of a diffractive optic element having a variable refractive index profile, according to certain embodiments.

FIG. 5 depicts a method 500 for fabrication of a diffractive optic element having a variable refractive index profile, according to certain embodiments. At block 504, the inkjet deposition system 108 receives the substrate 304.

At block 508, the inkjet deposition system 108 deposits an optical structure such as optical structure 314 of FIG. 3 or optical structure 414 of FIG. 4, having a thickness using an inkjet process on a portion of the substrate 304 or substrate 404, the optical structure being volumetrically varied to vary refractive properties of the optical structure.

Figure 6:
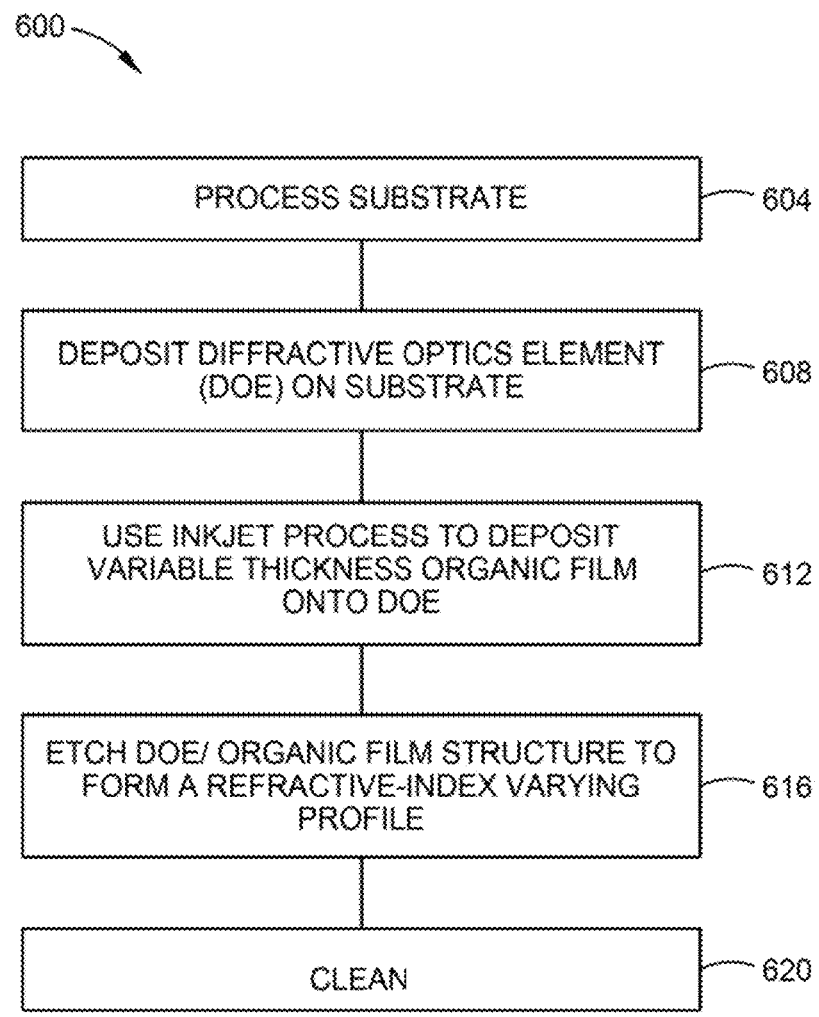
FIG. 6 depicts a flow diagram for the fabrication of a diffractive optic element having a variable refractive index profile, according to certain embodiments

FIG. 6 depicts a flow diagram 600 for the fabrication of a diffractive optic element having a variable refractive index profile, according to certain embodiments. At block 604 a substrate, such as substrate 704 depicted in FIG. 7, is processed in the pre-processing system 104, and at block 608 has a DOE 708 deposited thereon by pre-processing system 104, as depicted at process 710 of FIG. 7.

Figure 7:
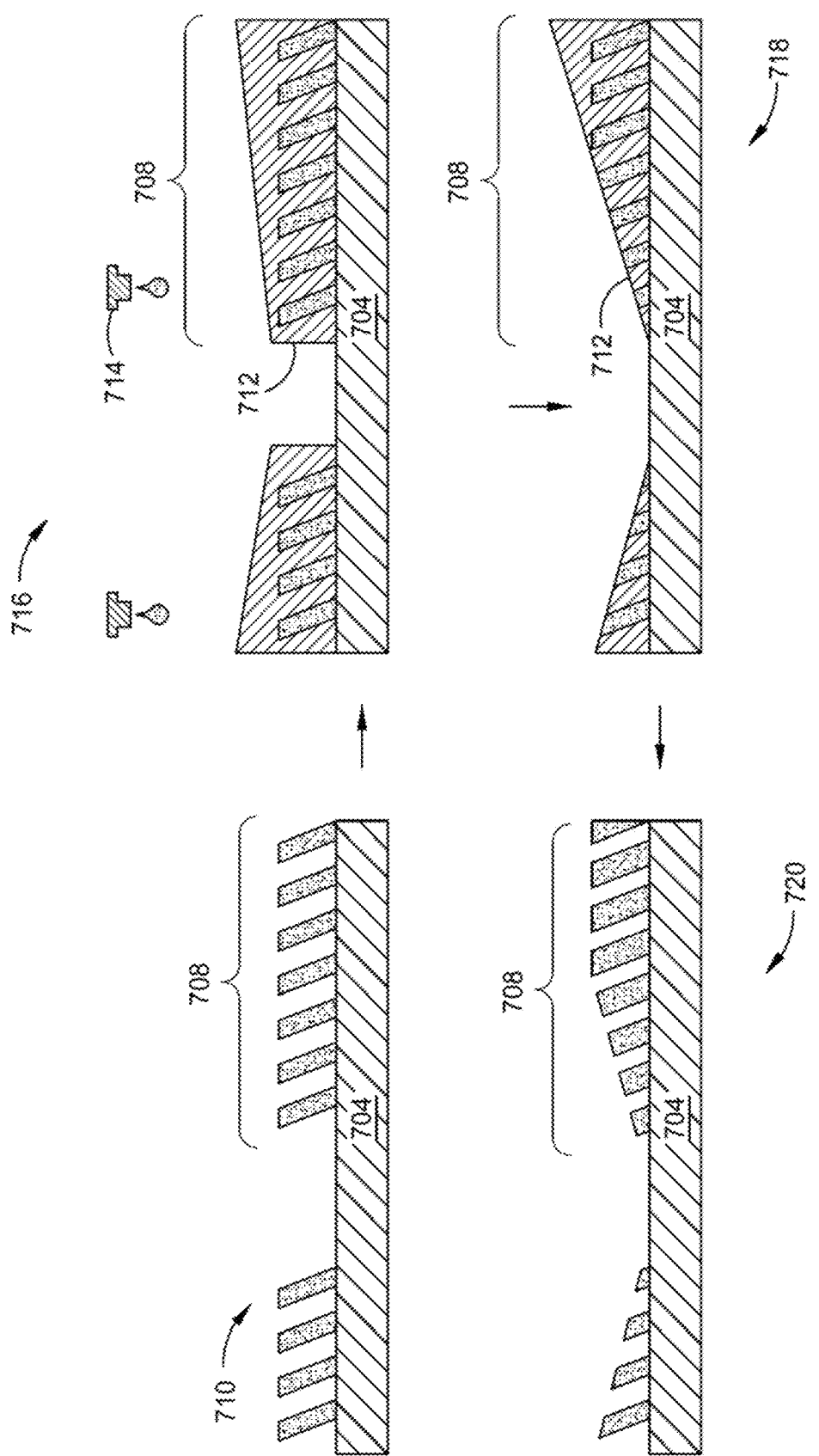
FIG. 7 depicts a process flow for the fabrication of a diffractive optic element having a variable refractive index profile, according to certain embodiments.

At block 612, the inkjet deposition system 108 deposits an organic film 712 with an inkjet nozzle 714 onto the DOE 708 to form an encapsulated DOE, as depicted at process 716 of FIG. 7. Although the organic film 712 has a profile of an irregular shape resembling a wedge (or other shape having an upper surface that is non-parallel to an upper or lower surface of the substrate 704), any shape may be deposited by inkjet nozzle 714 having a variable thickness. By way of example, organic film 712 may have a profile that is triangular, or a shape having more than four sides. In certain embodiments, the organic film 712 has a profile such as a rectangle, square, or the like.

At block 616, the etch system 116 etches the DOE 708 and organic film 712 to cause the DOE 708 to have a refractive index varying profile forming an encapsulated profiled DOE, as depicted at process 718 of FIG. 7.

At block 620 the substrate 704 and DOE 708 are cleaned, removing organic film 712, as depicted at process 720 of FIG. 7. According to certain embodiments, the substrate 704 and DOE 708 may be further process by infiltration system 120.

Figure 8:
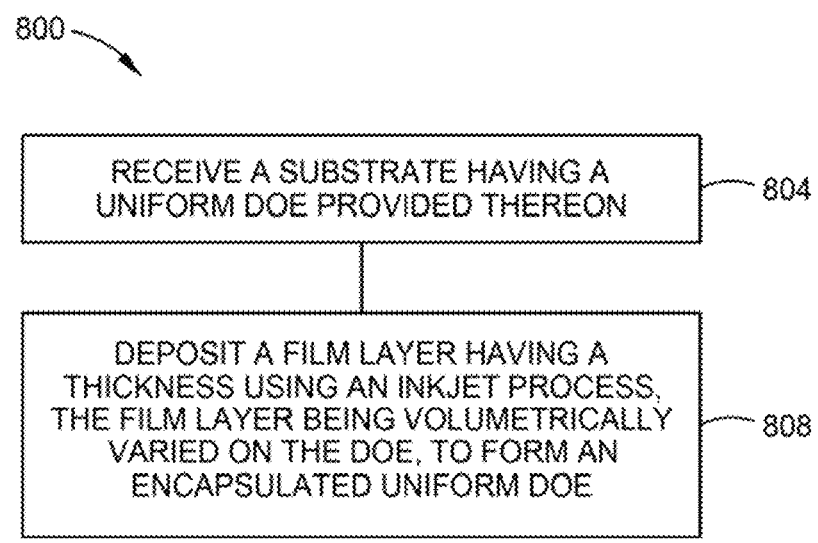
FIG. 8 depicts a method for fabrication of a diffractive optic element having a variable refractive index profile, according to certain embodiments.

FIG. 8 depicts a method 800 for fabrication of a diffractive optic element having a variable refractive index profile, according to certain embodiments.

At block 804, the inkjet deposition system 108 receives a substrate having a uniform DOE provided thereon.

At block 808, the inkjet deposition system 108 deposits a film layer having a thickness using an inkjet process, the film layer being volumetrically varied on the DOE, to form an encapsulated uniform DOE.

Example Processing System

Figure 9:
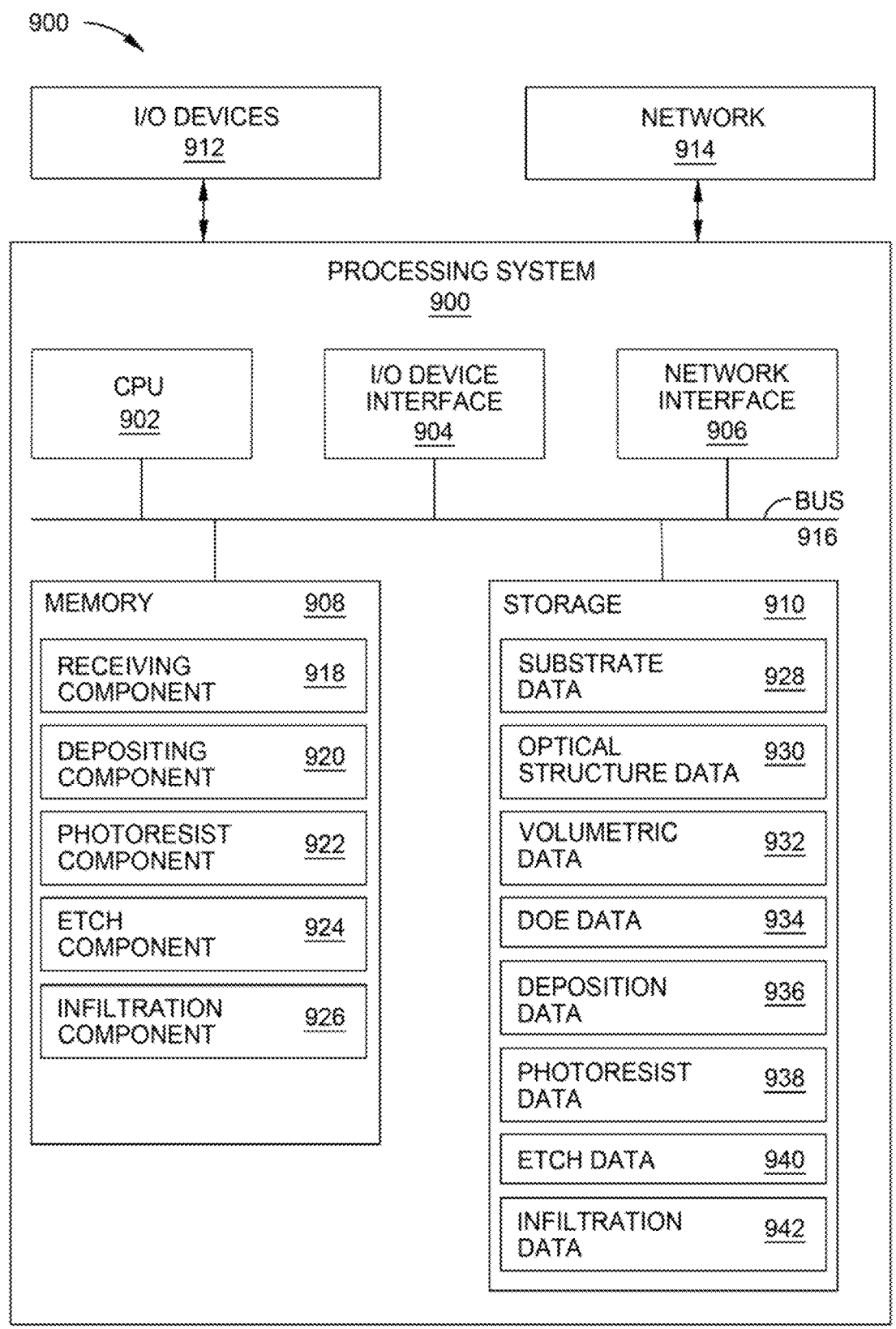
FIG. 9 depicts an example processing system that may be used to operate systems and methods and systems for fabrication of a diffractive optic element having a variable refractive index profile, according to certain embodiments.

FIG. 9 depicts an example processing system 900 that may be used to operate systems and methods and systems for fabrication of a diffractive optic element having a variable refractive index profile, according to certain embodiments, such as those described with respect to FIGS. 1-8.

Processing system 900 includes a central processing unit (CPU) 902 connected to a data bus 916. CPU 902 is configured to process computer-executable instructions, e.g., stored in memory 908 or storage 910, and to cause the processing system 900 to perform methods described herein, for example with respect to FIGS. 2, 5, 6, and 8. CPU 902 is included to be representative of a single CPU, multiple CPUs, a single CPU having multiple processing cores, and other forms of processing architecture capable of executing computer-executable instructions.

Processing system 900 further includes input/output (I/O) device(s) 912 and interfaces 904, which allows processing system 900 to interface with input/output devices 912, such as, for example, keyboards, displays, mouse devices, pen input, and other devices that allow for interaction with processing system 900. Note that processing system 900 may connect with external I/O devices through physical and wireless connections (e.g., an external display device).

Processing system 900 further includes a network interface 906, which provides processing system 900 with access to external network 914 and thereby external computing devices.

Processing system 900 further includes memory 908, which in this example includes a receiving component 918, depositing component 920, depositing component 922, photoresist component 924, and infiltration component 926, for performing operations described in FIGS. 2, 5, 6, and 8.

Note that while shown as a single memory 908 in FIG. 9 for simplicity, the various aspects stored in memory 908 may be stored in different physical memories, including memories remote from processing system 900, but all accessible by CPU 902 via internal data connections such as bus 916.

Storage 910 further includes substrate data 928, optical structure data 930, volumetric data 932, DOE data 934, deposition data 936, photoresist data 938, etch data 940, and infiltration data 942, as described in connection with FIGS. 1-8.

While not depicted in FIG. 9, other data may be included in storage 910.

As with memory 908, a single storage 910 is depicted in FIG. 9 for simplicity, but various aspects stored in storage 910 may be stored in different physical storages, but all accessible to CPU 902 via internal data connections, such as bus 916, or external connection, such as network interfaces 906. One of skill in the art will appreciate that one or more elements of processing system 900 may be located remotely and accessed via a network 914.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. In addition, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing, and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

While the foregoing is directed to examples of the present disclosure, other and further examples of the disclosure may be devised without departing from the basic scope thereof, and the scope thereof is determined by the claims that follow.

What is claimed is:

1. A system for fabricating a diffractive optics element (DOE) comprising:
   one or more processors; and
   a memory storing instructions that, when executed by the one or more processors, cause the system to:
      receive a substrate; and
      deposit an optical structure having a varying thickness using an inkjet process on a portion of the substrate, wherein depositing the optical structure comprises:
         depositing a first solution having a first refractive index using a first nozzle;
         depositing a second solution having a second refractive index using a second nozzle, the second refractive index being different than the first refractive index; and
         adjusting a volume of the first solution relative to a volume of the second solution to vary refractive properties and the thickness of the optical structure.

2. The system of claim 1, the one or more processors being further configured to cause the system to deposit a patterned photoresist layer over the optical structure.

3. The system of claim 2, the one or more processors being further configured to cause the system to etch the optical structure based on the patterned photoresist layer, to form a DOE.

4. The system of claim 3, wherein the optical structure is an inorganic optical structure.

5. The system of claim 3, wherein the optical structure is volumetrically varied by varying the thickness of the optical structure.

6. A non-transitory computer-readable storage medium storing instructions that, when executed by a processor of a processing system, cause the processing system to:
   receive a substrate; and
   deposit an optical structure having a varying thickness using an inkjet process on a portion of the substrate, wherein depositing the optical structure comprises:
      depositing a first solution having a first refractive index using a first nozzle;
      depositing a second solution having a second refractive index using a second nozzle, the second refractive index being different than the first refractive index; and
      adjusting a volume of the first solution relative to a volume of the second solution to vary refractive properties and thickness of the optical structure.

7. The non-transitory computer-readable storage medium of claim 6, the one or more processors being further configured to cause the system to deposit a patterned photoresist layer over the optical structure.

8. The non-transitory computer-readable storage medium of claim 7, the one or more processors being further configured to cause the system to etch the optical structure based on the patterned photoresist layer, to form a DOE.

9. The non-transitory computer-readable storage medium of claim 8, wherein the optical structure is volumetrically varied by varying the thickness of the optical structure.

10. A system for fabricating a diffractive optics element (DOE) comprising:
    one or more processors; and
    a memory storing instructions that, when executed by the one or more processors, cause the system to:
       receive a substrate having a uniform DOE provided thereon; and
       deposit a film layer having a varying thickness across a surface of the substrate using an inkjet process, wherein depositing the film layer comprises:
          depositing a first solution having a first refractive index using a first nozzle;
          depositing a second solution having a second refractive index using a second nozzle, the second refractive index being different than the first refractive index; and
          adjusting a volume of the first solution relative to a volume of the second solution to vary the refractive index and thickness of the DOE, to form an encapsulated uniform DOE.

11. The system of claim 10, the one or more processors further configured to cause the system to etch the encapsulated uniform DOE to form an encapsulated profiled DOE.

12. The system of claim 11, the one or more processors further configured to cause the system to remove the film layer.

13. The system of claim 12, wherein the film layer is an organic film layer.

14. The system of claim 12, wherein the film layer is volumetrically varied by varying the thickness of the film layer.

* * * * *